United States Patent [19]
Woolf et al.

[11] Patent Number: 5,108,982
[45] Date of Patent: Apr. 28, 1992

[54] APPARATUS AND METHOD FOR MANUFACTURING A CERAMIC SUPERCONDUCTOR COATED METAL FIBER

[75] Inventors: Lawrence D. Woolf, Carlsbad; Frederick H. Elsner, Cardiff; William A. Raggio, Del Mar, all of Calif.

[73] Assignee: General Atomics, San Diego, Calif.

[21] Appl. No.: 289,968

[22] Filed: Dec. 22, 1988

[51] Int. Cl.$^5$ ............................................. H01B 12/00
[52] U.S. Cl. ........................................ 505/1; 204/180.1; 204/180.2; 118/640
[58] Field of Search ................. 118/640; 505/842, 843, 505/933, 1; 204/180.1, 180.2; 423/263

[56] References Cited

U.S. PATENT DOCUMENTS

| | | | |
|---|---|---|---|
| 4,108,737 | 8/1978 | Ehrhardt | 204/13 |
| 4,126,523 | 11/1978 | Wong | 204/32.1 |
| 4,810,339 | 3/1989 | Heavens | 204/180.1 |
| 4,870,051 | 9/1989 | Maxfield | 505/1 |
| 4,939,121 | 7/1990 | Rybka | 505/1 |
| 4,942,151 | 7/1990 | Capone | 505/1 |
| 4,952,557 | 8/1990 | Schmidt | 505/1 |

FOREIGN PATENT DOCUMENTS 0292518 11/1988 Japan ........................................ 505/1

Primary Examiner—T. Tung
Assistant Examiner—Isabelle R. McAndrews
Attorney, Agent, or Firm—Nydegger & Associates

[57] ABSTRACT

An aqueous and method for manufacturing a ceramic superconductor coated metal fiber comprises a container for holding a nonaqueous solution in which particles of superconductor material are colloidally suspended to form a slurry. A voltage source is provided to influence the slurry with an electric field and a magnet device is provided to influence the slurry with a magnetic field. The magnetic field is oriented relative to the fiber to align the superconductor particles of the slurry in a desired orientation for subsequent attachment onto the surface of the fiber. The voltage source is connected to the metal fiber to electrically bias the fiber as it is drawn through the slurry. Consequently, charged superconductor particles in the slurry attach to the electrically biased fiber. Subsequently, the coated fiber is heated to sinter the aligned particles and establish a ceramic superconductor shell on the metallic fiber substrate.

28 Claims, 2 Drawing Sheets

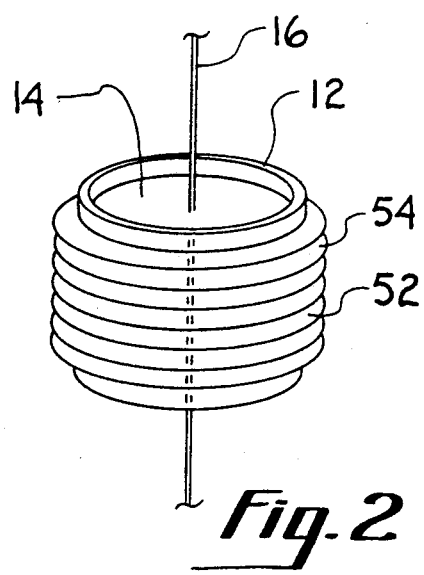 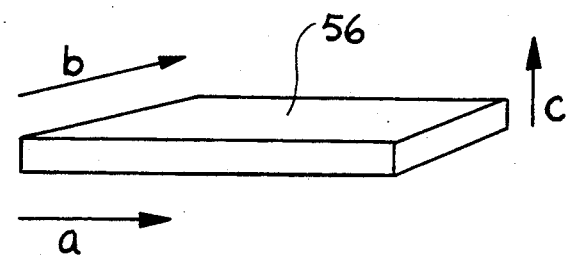 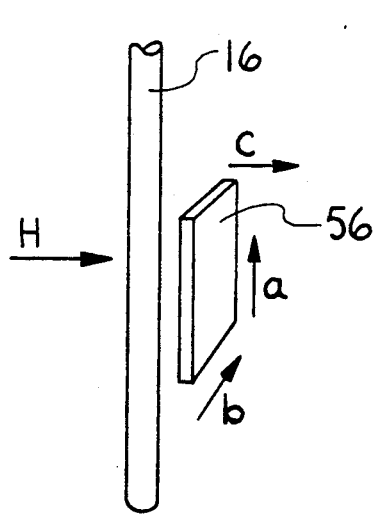 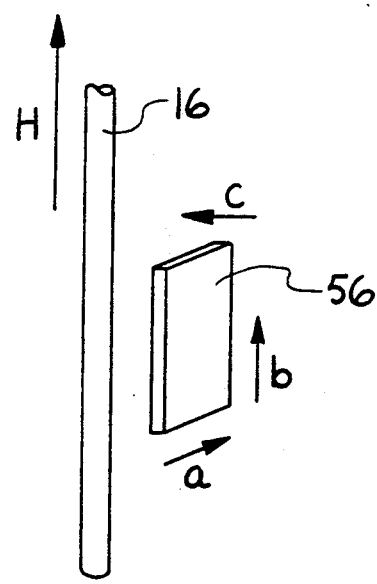

APPARATUS AND METHOD FOR MANUFACTURING A CERAMIC SUPERCONDUCTOR COATED METAL FIBER

FIELD OF THE INVENTION

The present invention relates to apparatus and methods for manufacturing superconductors. More particularly, the present invention relates to an apparatus which is useful for coating a metallic substrate with a superconductor material. The present invention is particularly, but not exclusively, useful for coating a metal fiber substrate with ceramic superconductor.

BACKGROUND OF THE INVENTION

It is now well known that certain materials exhibit exceptional electrical conductive properties which have earned them the distinctive designation of superconductors. Though many superconductor materials are known, ways in which superconductor materials can be incorporated into commercially viable products are not so well known. Indeed, in recent years, extensive efforts have been made to solve many of the problems which confront the manufacturers of superconductor products One particular class of superconductor materials which has attracted a great deal of interest for its potential use in commercial products is the so-called 1-2-3 materials that include rare earth elements (RE) and are from the group identified as RE $Ba_2Cu_3O_{7-x}$. For commercial purposes, it has been determined that these materials are particularly effective in a ceramic form which is made by sintering very fine crystalline particles of 1-2-3. Of importance to the present invention is the fact that, due primarily to properties of the rare earth elements in the particular crystalline structure of these 1-2-3 particles, they can be effectively influenced by a magnetic field before they are sintered. Importantly, it is desirable that the superconductor particles have animotropic magnetic susceptibilities. Further, since the par can also be charged before they are sintered, they can also be influenced by an electric field.

With the above in mind, one problem which has heretofore confronted persons skilled in the superconductor art concerns how to support the inherently brittle superconductor ceramic. An obvious solution is to use some form of a supporting substrate. Though substrates of various forms may be used, for certain applications a substrate in the form of a fiber, a wire or a ribbon is ideal. Unfortunately, effectively placing a superconductor ceramic on such a substrate is not easy. For one thing, the ceramic needs to be directly attached to the substrate. Furthermore, the superconductor layer should preferably be of uniform thickness and relatively thin. The present invention recognizes that one way in which to use these substrates is to deposit a thin layer of very fine particles of 1-2-3 on the substrate before they are sintered into a ceramic.

Electrophoresis is a well known process for coating metal substrates which involves the motion of colloidal particles suspended in a fluid medium due to the influence of an electric field on the medium. Although some superconductor materials are not adversely affected by water, unfortunately, the 1-2-3 material deteriorates when exposed to moisture. Thus, when 1-2-3 superconductor materials are used, the fluid mediums typically used for electrophoresis, which include water, can not be used in a procedure to coat a metal substrate with fine superconductor particles. The present invention, however, recognizes that an electrophoresis procedure can be accomplished using a nonaqueous solution as the fluid medium. Further, the present invention recognizes that a magnetic field will affect the superconductor particles in the medium to align them on the substrate in an optimal orientation.

In light of the above, it is an object of the present invention to provide an apparatus for attaching superconductor particles to a metal substrate. Another object of the present invention is to provide an apparatus which uses a nonaqueous fluid medium in an electrophoresis procedure to coat a metallic substrate with superconductor particles. Yet another object of the present invention is to provide an apparatus which magnetically aligns superconductor particles in a desired orientation on a metallic substrate during the coating process. Still another object of the present invention is to provide a method for coating a metal substrate with magnetically aligned superconductor particles. Another object of the present invention is to provide an apparatus for coating metallic substrates that is relatively easy to manufacture, relatively simple to operate and cost effective.

SUMMARY OF THE INVENTION

A preferred embodiment of the apparatus for manufacturing a ceramic superconductor coated metal fiber comprises a container for holding a nonaqueous solution of isopropanol and ethanolamine in which charged particles of superconductor material are suspended to form a slurry. An electrode (e.g. anode) is electrically connected to a voltage source and is placed in electrical contact with the slurry. Similarly, the metal fiber substrate is electrically connected to the voltage source to establish a counterelectrode (e.g. cathode) and is submersed in the slurry. The voltage of the voltage source is then set to influence the slurry with an electric field having a level which causes the charged superconductor particles in the slurry to attach to the metal fiber substrate counterelectrode and coat the fiber with superconductor material.

A magnet device may be positioned externally to the container to influence the slurry with a magnetic field. Depending on the magnetic properties of the particular superconductor particles and the desired alignment of these particles on the fiber substrate, the field can be generally directed either parallel or perpendicular to the longitudinal axis of the fiber substrate. Further, in order to enhance uniform coating of the fiber in the presence of this magnetic field, the apparatus may have means to rotate either the fiber or the magnet device while the fiber is being drawn through the solution Additionally, the apparatus may comprise means to continuously feed the metal fiber substrate into the slurry and to respectively withdraw the fiber therefrom once it is coated with superconductor particles.

In addition to the basic elements of the present invention which comprise the slurry container, magnet device and voltage source, means may be provided to maintain superconductor particle concentration in the nonaqueous solution at a substantially constant level. This is done by an incorporated control system which adds high concentration slurry through a supply valve on a holding tank to the slurry in the container and which simultaneously draws off low concentration slurry from the container through a drain valve on the container. A sampling probe can be provided and inserted into the container to take readings of the superconductor concentration levels in the slurry. A signal proportional to a reading can be used by electronic componentry to appropriately operate the supply valve and drain valve to maintain a substantially constant level of superconductor particle concentration in the container.

In the method for manufacturing a ceramic superconductor coated metal fiber, fine particles of superconductor material are suspended in a solution comprising isopropanol and ethanolamine. The resultant slurry is ultrasonically agitated or ball milled to disperse, charge and deagglomerate the particles prior to being influenced by the electric field. The fiber substrate is electrically connected to a voltage source to bias the fiber and it is then drawn through the slurry. While the fiber is being drawn through the slurry in a continuous operation, either the fiber or the magnet may be rotated in order to achieve a more uniform coating of magnetically aligned superconductor particles. After leaving the slurry with its superconductor particle coating, the coated fiber may be heated in the range of approximately 900° C. to 950° C. to sinter the superconductor particles and create a ceramic shell on the substrate.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWINGS

FIG. 2 is a perspective view of an alternate embodiment of the magnet device of the apparatus;

FIG. 3 is an isometric view of an idealized superconductor crystalline particle; and FIGS. 4A and 4B illustrate desired alignments of superconductor particles in different magnetic fields.

DESCRIPTION OF THE PREFERRED EMBODIMENT

Figure 1:
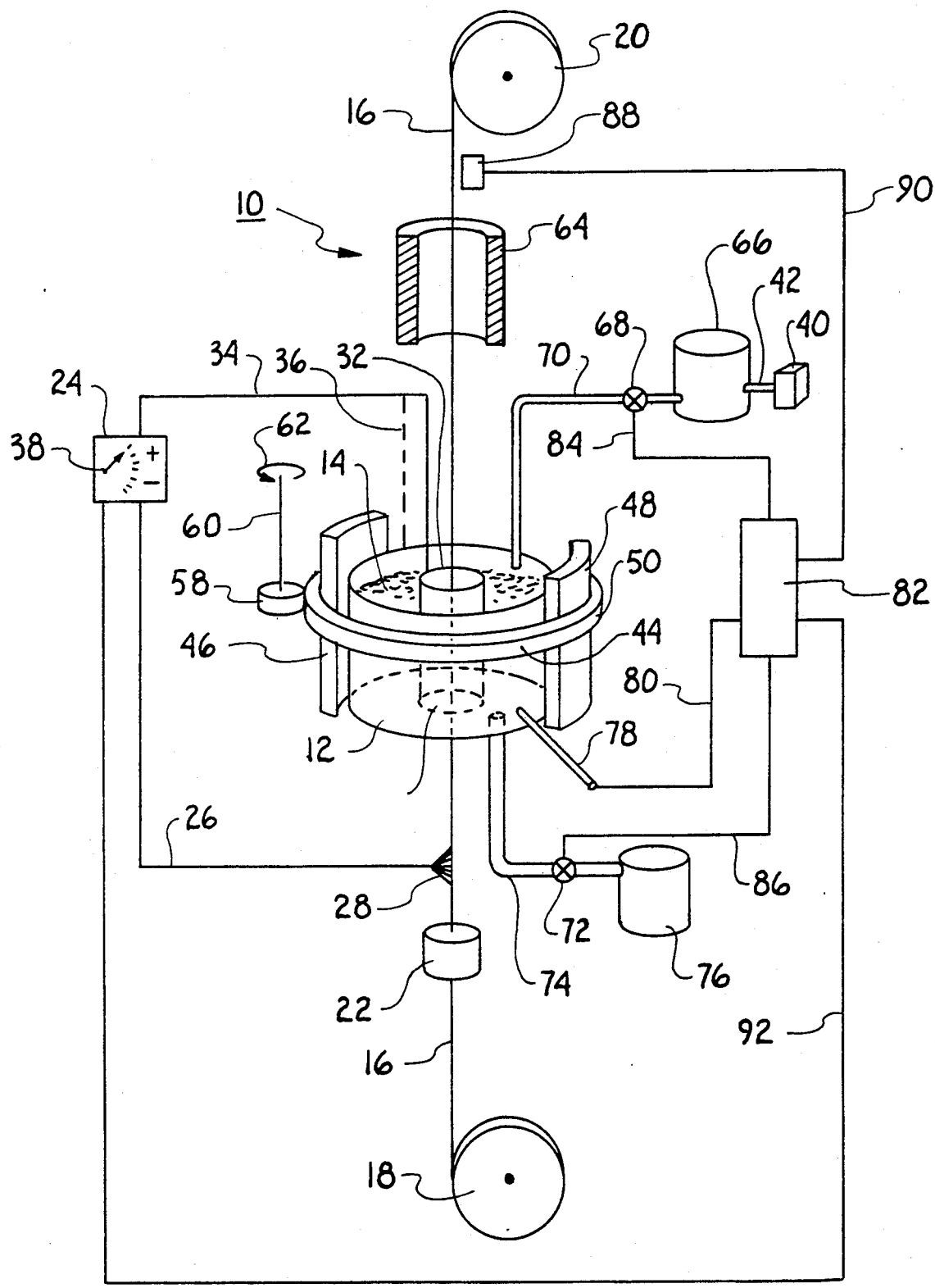
FIG. 1 is a schematic of the apparatus with various portions shown in perspective, in cross section or in phantom for clarity.

Referring initially to FIG. 1, the apparatus for manufacturing a ceramic superconductor coated metal fiber is shown and generally designated 10. As shown, apparatus 10 includes a container 12 for holding a slurry 14 in which very fine particles of superconductor material are suspended. Preferably, the superconductor material is from the group identified as RE $Ba_2Cu_3O_{7-x}$ (where x is in the range of 0-1). Importantly, when this preferred superconductor material is used, slurry 14 comprises a nonaqueous solution. Further, the nonaqueous solution should be nonreactive with the superconductor material and preferably comprise a solvent, such as isopropanol, with a relatively small amount (e.g. approximately 0.1-5% of the solution) of an additive, such as ethanolamine, which is dissolved in the solvent to enhance the ability of the superconductor materials suspended therein to carry an electrical charge. It will be understood by the skilled artisan that other additives, such as dibutylamine, urea, or a product commercially known as Emphos P21, may be used instead of ethanolamine. In any event, the slurry 14 must remain effectively moisture-free and both the solvent (isopropanol) and the additive (ethanolamine) in slurry 14 should evaporate or decompose at relatively low temperatures (i.e. somewhere below 300° C.) in order to prevent subsequent reactions of these ingredients with the superconductor material.

In accordance with the present invention, a metallic substrate 16, on which the superconductor particles suspended in slurry 14 are to be coated, is fed into or suspended in the slurry 14. This substrate 16 may be formed as either a ribbon or a wire fiber. The actual form or configuration of substrate 16 is not, however, a limiting consideration. In fact, any configuration will work so long as it can function effectively as an electrode.

In addition to its electrical properties, substrate 16 should not interdiffuse with the superconductor particles. Thus, substrate 16 can be made of an inert metal such as gold or silver. When, however, a less expensive, more cost effective material is used (i.e. one which is not noble), substrate 16 will preferably lend itself to the establishment of an oxide barrier on its surface which will minimize the interdiffusion of substrate 16 with the superconductor particles. Thus, substrate 16 should either be made of an oxide forming material, such as the wire commercially available as Hoskins 875, or have a thin oxide layer deposited on it, such as Barium Zirconate ($BaZrO_3$). Preferably, substrate 16 is made of an oxide forming material such as used for the wire of Hoskins 875. This is so because such a substrate 16 can be electrophoretically coated with superconductor particles at relatively low temperatures before being subjected to the much higher temperatures which are necessary to form an oxide barrier on the surface of substrate 16 (e.g. 850° C.). In this regard, it is important to recognize that when an oxide forming material is used, the electrophoresis process necessarily precedes formation of the oxide barrier because an oxide barrier will tend to electrically insulate substrate 16. Suitable oxide forming materials for substrate 16 are materials, such as alumel or the commercially available material discussed above and known as Hoskins 875. Such materials will create an effective oxide barrier between substrate 16 and the superconductor coating during subsequent procedures wherein the superconductor particles are sintered into a ceramic. Examples of such procedures are disclosed in a co-pending application for an invention entitled "Substrate for Ceramic Superconductor" which is assigned to the same assignee as the present invention. On the other hand, when a substrate 16 has a preformed oxide barrier, the barrier should not electrically insulate the substrate 16 to the point where an electrophoresis process is made ineffectual. For example, a suitable material in this case would be Nicrosil coated with Barium Zirconate.

As shown in FIG. 1, substrate 16 is fed from a supply spool 18 and through slurry 14 in container 12 to a take-up spool 20. More specifically, after leaving supply spool 18, substrate 16 is passed through a precleaner 22 (e.g. a furnace or a solvent in an ultrasonic bath) where it is cleaned of dust and other debris which may have settled onto the substrate 16 during handling As also shown in FIG. 1, substrate 16 is electrically biased. For this purpose, a voltage source 24 is placed in electrical contact with substrate 16 through line conductor 26 by any means known in the art, such as brush 28. Further, it will be appreciated that voltage source 24 could be a device, well known in the pertinent art, which provides a constant current. Also, though not shown, it will be appreciated that substrate 16 can be electrically biased by any direct electrical connection between voltage source 24 and substrate 16. Regardless, after leaving precleaner 22, substrate 16 is then passed into container 12 via inlet 30.

In addition to being electrically connected with substrate 16, voltage source 24 is also electrically connected with an open-ended metallic foil cylindrical tube 32. As shown in FIG. 1, tube 32 is submersed in slurry 14 and is electrically connected to voltage source 24 via line 34. With this arrangement, slurry 14 in container 12 is influenced by the electric field established between an electrode (i.e. tube 32) and a counterelectrode (i.e. substrate 16). Alternatively, tube 32 can be eliminated and voltage source 24 directly connected to container 12 via line 36. This connection will then establish container 12 as the electrode of the apparatus 10. This, of course, requires that container 12 be made of an electrically conducting material.

As shown in FIG. 1, tube 32 is established as the anode and substrate 16 is established as the cathode. It will be appreciated by skilled artisans, however, that the charges on electrodes and counterelectrodes can be alternated and, further, that the manipulation of rheostat 38 on voltage source 24 will vary the level of the voltage potential between anode and cathode. Typically, voltages of from 1–100 volts and corresponding currents in the range of 10 microamps to 1 milliamp are effective for the purposes of the present invention. Further, it is to be appreciated that rheostat 38 (or a digital voltage source) can be used to establish the voltage levels of the electric field influencing slurry 14 and thereby effectively establish the thickness of the coating of superconductor particles on substrate 16.

While varying the voltage level in slurry 14 is, perhaps, the most practical way by which to control coating thickness, it will be appreciated that other factors also affect this thickness. For instance, the concentration of superconductor particles in slurry 14, the time in which substrate 16 is submersed in slurry 14, and the mobility of the superconductor particles through slurry 14 are all factors which affect the electrophoresis process.

The electric field influencing slurry 14 is set to cause the superconductor particles, which are colloidally suspended in the slurry 14, to migrate toward substrate 16 and become attached thereto. This process will, of course, require that the superconductor particles carry a charge. To accomplish this, the superconductor particles are mixed with the nonaqueous solution and then agitated. Effective agitation can be done either ultrasonically or by milling the particles in a manner well known in the pertinent art. Although slurry 14 should not be vibrated once it is placed into container 12, an effective way in which slurry 14 may be vibrated is by ultrasonic energy which is generated by an ultrasonic source 40 that is operatively connected to tank 66. A transducer probe 42 extends from source 40 into slurry 14 in container 66 to agitate the superconductor particles therein to charge the particles in a manner well known in the art. It will be recalled that the additive ethanolamine in slurry 14 is also intended to enhance the charge on superconductor particles.

An important feature of apparatus 10 is that slurry 14, in addition to being influenced by an electric field, is also influenced by a magnetic field. For this purpose, a magnet device 44 is provided. In FIG. 1, the magnet device 44 is shown as a pair of permanent magnets, respectively designated 46 and 48, which are connected together by a flux return element 50 and positioned externally to container 12 on substantially opposite sides thereof. With this configuration, slurry 14 is effectively influenced by a magnetic field whose strength and uniformity is dependent, in part, on the size of magnets 46, 48 and whose flux lines within slurry 14 are substantially aligned in a direction which is perpendicular to the longitudinal axis of substrate 16.

In an alternate embodiment, a magnet device 52, comprising a solenoid winding 54, as shown in FIG. 2, may be used. The magnetic field strength of this magnet device 52 will depend, in part, on the current in winding 54 and the direction of the flux lines generated by magnet device 52 will be in a direction which is substantially parallel to the longitudinal axis of substrate 16. From the discussion below, it will be seen that it is important for the direction of flux to be compatible with the magnetic properties of the 1-2-3 particles.

An exemplary configuration of a superconductor particle is shown as plate 56 in FIG. 3. In this form, it is known that the critical current densities ($J_c$) of the plate 56 vary according to the axis along which current flows. Specifically, $J_c$ in both the "a" and "b" directions shown in FIG. 3 are on the order of thirty (30) times greater than $J_c$ in the "c" direction. Accordingly, in order to optimize current flow in the resultant product, it is desirable if plates 56 are properly oriented on substrate 16 with their respective "c" directions substantially perpendicular to the longitudinal axis of substrate 16. The magnetic field generated by magnet device 44 or magnet device 52 is intended to accomplish this.

Fortunately, with the use of RE $Ba_2Cu_3O_{7-x}$ (i.e. 1-2-3) as the superconductor material, the orientation of a plate 56 in a magnetic field of flux H is, at least to some extent, predictable. Specifically, some rare earth 1-2-3 materials orient in a flux field H with their "c" direction parallel to the lines as shown in FIG. 4A, while others orient themselves with their "c" direction perpendicular to the lines of flux as shown in FIG. 4B. For example, the rare earth elements which orient with the "c" direction parallel to H include Yttrium (Y), Neodymium (Nd), Samarium (Sm), Dysprosium (Dy) and Holmium (Ho). On the other hand, the rare earth elements which orient with the "c" direction perpendicular to H include Europium (Eu), Erbium Er), Thulium (Tm) and Ytterbium (Yb). Thus, magnet device 44 may be better suited for use with some rare earth superconductors, while magnet device 52 will be better suited for the others.

In the particular case shown in FIG. 4A, where plate 56 orients with its "c" direction parallel to H, there is the potential for a nonuniform anisotropic coating of substrate 16 due to the relative thinness of plate 56 in its "c" direction. To overcome this potential problem, substrate 16 can be rotated during the coating process or the magnet device itself can be rotated. Though not shown, it will be appreciated that substrate 16 may be rotated by any means well known in the art. Further, substrate 16 need not necessarily pass through slurry 14. Instead, substrate 16 may be suspended in slurry 14 and rotated therein. In any case, to avoid an anisotropic coating, it is necessary to charge substrate 16 and rotate it in slurry 14 to obtain a uniform coating of the magnetically influenced superconductor particles. Referring back to FIG. 1, it will be appreciated that magnet device 44 can be slidingly mounted on container 12 for rotation with respect thereto. A roller 58 can be operatively engaged with magnet device 44, by any means well known in the art, so that rotation of roller 58 about an axis 60 in the direction of arrow 62 will cause magnet device 44 to rotate about container 12 while maintaining flux lines in slurry 14 substantially perpendicular to the longitudinal axis of substrate 16. Thus, an anisotropic coating of substrate 16 can be obviated.

As shown in FIG. 1, magnets 44, 46 partially extend above container 12. Accordingly, the superconductor particles from slurry 14 which attach to substrate 12 continue to be influenced by a magnetic field even after passing through slurry 14. This configuration is established in order to keep the superconductor particles properly aligned on substrate 16 during the evaporation of nonaqueous solution, and prior to sintering.

An oven 64 is provided to sinter the superconductor particles which are attached to substrate 16 into a ceramic. The ceramic superconductor coated substrate 16 can then be wound onto take-up spool 20 and used thereafter as desired.

During the continuous process of coating substrate 16 with superconductor particles, it may be desirable to maintain the concentration of superconductor particles in slurry 14 at a substantially constant level. To accomplish this, a slurry 14 having slightly higher superconductor particle concentration levels than desired for use in container 12 is provided and held in supply tank 66. The operation of supply valve 68 will open pipe 70 and allow high concentration slurry 14 from supply tank 66 to be introduced into the slurry 14 in container 12. Simultaneously, operation of drain valve 72 allows low concentration slurry 14 in container 12 to be withdrawn from container 12 through pipe 74 into holding tank 76.

The maintenance of superconductor concentration levels in container 12 can be accomplished with a closed loop feedback control system. In this system, a probe 78 is inserted into slurry 14 and is used to test samples of slurry 14 for viscosity and generate a reading of the superconductor concentration levels in the samples. Probe 78 may be of any type well known in the art for testing fluid viscosity. This reading is transmitted via line 80 to a microprocessor 82 which, depending on the concentration level indicated by the reading from probe 78, will transmit signals via lines 84, 86 to supply valve 68 and drain valve 72, respectively, to charge the flow through the valves 68, 72 to effectively maintain the concentration of superconductor particles in slurry 14 in container 12 at the desired level.

The thickness of the superconductor ceramic coating of substrate 16 can be automatically controlled using microprocessor 82 in a standard closed loop feedback control system similar to the one used for controlling slurry 14 superconductor concentration. Specifically, any device 88, that is well known in the art for measuring the diameter of a wire, can be positioned relative to substrate 16 to determine the diameter of the ceramic coated substrate 16. This measurement can then be sent as an electrical signal via line 90 to microprocessor 82. Microprocessor 82 then compares the signal from device 88 with a predetermined reference level to establish an error signal. This error signal is then sent via line 92 to rheostat 38 and, depending on the sign and magnitude of this error signal, rheostat 38 is moved to vary the voltage level of source 24 to control the thickness of superconductor ceramic coating on substrate 16.

It is to be appreciated that when 1-2-3 superconductor materials are used, the herein disclosed method for coating a metallic substrate 16 with a superconductor coating must be accomplished in a substantially moisture-free environment. This is so in order to preserve the coatability of the slurry and prevent contamination of the superconductor material. Accordingly, it is preferable that apparatus 10 be enclosed in a dry room where the ambient humidity and carbon dioxide concentrations can be controlled and maintained at very low levels.

While a particular apparatus for manufacturing a superconductor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. An apparatus for manufacturing a ceramic superconductor having oxygen and cooper constituents which comprises:
   a container for holding a solution, said solution including a nonaqueous solvent, a charging agent and superconductor particles suspended therein to form a slurry;
   a voltage source;
   an electrode electrically connected to said voltage source and having a portion thereof submersed in said slurry;
   a substrate electrically connected with said voltage source to establish said substrate as a counterelectrode having at least a portion thereof submersed in said slurry;
   means for influencing a voltage level from said voltage source to cause said superconductor particles to attach to said substrate; and
   a magnet positioned externally to said container to influence said slurry with a magnetic field.

2. An apparatus for manufacturing a superconductor as recited in claim 1 wherein said magnet device comprises a pair of permanent magnets, each of said magnets being positioned externally to said container with said container therebetween to establish a magnetic field through said solution for aligning said superconductor particles.

3. An apparatus for manufacturing a superconductor as recited in claim 1 wherein said magnet device is a solenoid.

4. An apparatus for manufacturing a superconductor as recited in claim 1 wherein said container further comprises:
   an inlet;
   means for continuously feeding said substrate into said slurry through said inlet; and
   means for withdrawing said substrate with said attached superconductor particles from said slurry.

5. An apparatus for manufacturing a superconductor as recited in claim 4 wherein said substrate is a wire.

6. An apparatus for manufacturing a superconductor as recited in claim 1 wherein said substrate is made of a material having a native oxide for forming a surrounding layer of oxide on said substrate.

7. An apparatus for manufacturing a superconductor as recited in claim 1 wherein said substrate further comprises an oxide barrier layer on the surface of said substrate.

8. An apparatus for manufacturing a superconductor as recited in claim 4 further comprising means for maintaining the concentration of said suspended superconductor particles in said solution at a predetermined substantially constant level.

9. An apparatus for manufacturing a superconductor as recited in claim 8 wherein said concentration maintaining means comprises:
a drain valve incorporated into said container for withdrawing relatively lower superconductor concentration slurry from said container; and
a tank containing a slurry of relatively higher superconductor concentration solution, said tank having a supply valve operable to introduce predetermined amounts of said relatively high superconductor concentration slurry into said container.

10. An apparatus for manufacturing a superconductor as in claim 9 wherein said concentration maintaining means further comprises:
a sapling probe mounted on said container and inserted into said slurry in said container for obtaining samples thereof;
means for determining the concentration level of superconductor materials in said slurry in said container; and
means responsive to the concentration level to activate said drain valve and said supply valve to maintain the concentration of said slurry in said container at the predetermined substantially constant level.

11. An apparatus for manufacturing a superconductor as recited in claim 4 further comprising means for cleaning said substrate before said substrate is fed into said container.

12. An apparatus for manufacturing a superconductor as recited in claim 1 further comprising means for rotating said substrate in said container to provide for uniform attachment of said superconductor particles to said substrate under the influence of the magnetic field generated by said magnet device.

13. An apparatus for manufacturing a superconductor as recited in claim 1 further comprising means for rotating magnet device around said container to provide for uniform attachment of said superconductor particles to said substrate under the influence of the magnetic field generated by said magnet device.

14. An apparatus for manufacturing a superconductor as recited in claim 1 further comprising means for maintaining said container is a substantially moisture-free environment.

15. An apparatus for manufacturing a superconductor as recited in claim 1 wherein said nonaqueous solvent is isopropanol and said charging agent is ethanolamine.

16. An apparatus for manufacturing a superconductor as recited in claim 1 wherein said superconducting particles are from the group identified as RE $Ba_2Cu_3O_{7-x}$ where x can have values in the range from zero (0) to one-tenth (0.1).

17. An apparatus for manufacturing a superconductor as recited in claim 1 wherein said electrode is supported in said slurry at a distance of approximately one (1) cm from said counterelectrode substrate.

18. An apparatus for manufacturing a superconductor as recited in claim 5 wherein said wire substrate is alumel.

19. An apparatus for manufacturing a superconductor as recited in claim 5 wherein said substrate is Hoskins 875.

20. An apparatus for manufacturing a superconductor as recited in claim 7 wherein said oxide barrier is Barium Zirconate.

21. An apparatus for manufacturing a superconductor as recited in claim 1 further comprising:
means for determining the thickness of said superconductor particles on said substrate; and
means responsive to said thickness determining means for varying said voltage level to maintain the thickness of said superconductor particles on said substrate at a preselected thickness.

22. An apparatus for electrically coating a metal substrate with ceramic superconductor particles having oxygen and copper constituents which comprises:
means for holding a slurry of superconductor particles suspended in a nonaqueous solution;
a magnet positioned adjacent said holding means for influencing said slurry with a magnetic field;
means for electrically biasing said substrate; and
means for suspending said substrate in said slurry to attach said superconductor particles thereto in a magnetically aligned orientation thereof.

23. An apparatus for electrically coating a metal substrate with superconductor particles as recited in claim 22 wherein said holding means is a metal container.

24. An apparatus for electrically coating a metal substrate with superconductor particles as recited in claim 22 wherein said means for influencing said slurry with an electric field is a voltage source electrically connected with said container to establish said container as an electrode and electrically connected with said substrate to establish said substrate as a counterelectrode.

25. An apparatus for electrically coating a metal substrate with superconductor particles as recited in claim 22 further comprising means for agitating said superconductor particles to establish a charge thereon.

26. An apparatus for electrically coating a metal substrate with ceramic superconductor particles having oxygen and copper constituents which comprises:
means for holding a slurry of superconductor particles suspended in a nonaqueous solution containing a charging agent;
a magnet positioned externally to said holding means to influence said slurry with a magnetic field;
means for electrically biasing said substrate; and
means for suspending said substrate in said slurry to attach said superconductor particles thereto in a magnetically aligned orientation thereof.

27. An apparatus for manufacturing a superconductor as recited in claim 26 wherein said magnet device comprises a pair of permanent magnets, each of said magnets being positioned externally to said container with said container therebetween to establish a magnetic field through said solution for aligning said superconductor particles.

28. An apparatus for manufacturing a superconductor as recited in claim 26 wherein said magnet device is a solenoid.

* * * * *

UNITED STATES PATENT AND TRADEMARK OFFICE
CERTIFICATE OF CORRECTION

Page 1 of 2

PATENT NO. : 5,108,982
DATED : April 28, 1992
INVENTOR(S) : Lawrence D. Woolf, et al.

It is certified that error appears in the above-identified patent and that said Letters Patent is hereby corrected as shown below:

Title page,
Abstract, Line 1
DELETE
[An aqueous and method]
INSERT
--An apparatus and method--

Column 1, Line 40
DELETE
[have animotropic magnetic susceptibilities.]
INSERT
--have anisotropic magnetic susceptibilities--

Column 1, Line 41
DELETE
[since the par can also be charged]
INSERT
--since the particles can also be charged--

UNITED STATES PATENT AND TRADEMARK OFFICE
CERTIFICATE OF CORRECTION

PATENT NO. : 5,108,982
DATED : April 28, 1992
INVENTOR(S) : Lawrence D. Woolf, et. al.

It is certified that error appears in the above-identified patent and that said Letters Patent is hereby corrected as shown below:

```
Colum 8, Line 19
DELETE
[oxygen and cooper constituents]
INSERT
--oxygen and copper constituents--
```

Signed and Sealed this

Ninth Day of February, 1999

Attest:

Attesting Officer

*Acting Commissioner of Patents and Trademarks*